United States Patent [19]

Naylor

[11] Patent Number: 5,430,877

[45] Date of Patent: Jul. 4, 1995

[54] REPROGRAMMING METHODS AND APPARATUS

[75] Inventor: Rowan Naylor, Hampshire, United Kingdom

[73] Assignee: Orbitel Mobile Communications Limited, Berkshire, United Kingdom

[21] Appl. No.: 94,460

[22] Filed: Jul. 20, 1993

[30] Foreign Application Priority Data

Jul. 21, 1992 [GB] United Kingdom ............... 9215475

[51] Int. Cl.⁶ ............................................. G06F 13/00
[52] U.S. Cl. ........................... 395/700; 364/DIG. 1; 364/230.4; 364/284; 364/284.3; 364/284.4; 364/285; 364/285.4; 395/200
[58] Field of Search .............................. 395/700, 200; 364/230.4, 284, 284.3, 284.4, 285, 285.4

[56] References Cited

U.S. PATENT DOCUMENTS 4,525,865  6/1985  Mears .
5,155,847  10/1992  Kirovac et al. ................. 395/600

FOREIGN PATENT DOCUMENTS 0217351  4/1987  European Pat. Off. .
0284924  10/1988  European Pat. Off. .
0378846  7/1990  European Pat. Off. .
0396834  11/1990  European Pat. Off. .
2256734  12/1992  United Kingdom .
WO91/02313  2/1991  WIPO .

OTHER PUBLICATIONS

Article: Microprocessors and Microsystems, vol. 14, No. 8, Oct. 1990, pp. 543–547, Zales et al.

Primary Examiner—Kevin A. Kriess
Assistant Examiner—Jonathan Hall Backenstose
Attorney, Agent, or Firm—Leydig, Voit & Mayer, Ltd.

[57] ABSTRACT

Two mobile communications handset terminals for a cellular telephone system each incorporate a microprocessor for controlling the operating components of the terminal. Each microprocessor operates under control of software stored in a FLASH Eprom. When the two units are interconnected by a special cable loom, a 12 volt supply of one of the units is applied to the FLASH Eprom of that unit, switching it into a reprogramming mode. This 12 volt supply is also applied via an output terminal to the FLASH Eprom of the other unit which is thus likewise switched into a reprogramming mode. Via the cable loom, each handset compares the grade of the software stored in its FLASH Eprom with the grade of software stored in the other's FLASH Eprom. The handset storing the higher grade software then assumes a MASTER mode and the other one assumes a SLAVE mode. The lower grade software in the SLAVE handset is erased from its FLASH Eprom and replaced with the higher grade software from the MASTER hand set. In this way, once a handset has been re-programmed with the latest update of software, it can itself be used to reprogram other handsets.

13 Claims, 3 Drawing Sheets

REPROGRAMMING METHODS AND APPARATUS

The invention relates to reprogramming methods and apparatus. In one particular application, the invention relates to methods and apparatus for reprogramming mobile communications terminals. However, the invention is generally applicable to the reprogramming of any microprocessor-based system or equipment.

According to the invention, there is provided a method of reprogramming a computer-controlled unit so as to upgrade software stored in reprogrammable memory means in the unit, comprising the steps of interconnecting the unit with a second, similar, unit, comparing the grades of the software respectively stored in the memory means of the two units to determine which (if either) of them is storing the software of the higher grade, and using the unit which is storing the software of the higher grade to replace or revise the software of the other unit so that it also is of the higher grade.

According to the invention, there is also provided a method of reprogramming software stored in reprogrammable memory means of a microprocessor-based unit, in which the reprogrammable memory means is switchable between a normal operating mode and a reprogrammable mode, comprising the steps of interconnecting the unit with another, similar, unit, switching the reprogrammable memory means of a first one of the unit into the reprogrammable mode, causing the first unit to switch the reprogrammable memory means of the second unit into the reprogrammable mode, causing each unit to signal to the other the current grade of the software stored in its reprogrammable memory means, carrying out a comparison step at each unit by which the grade of its software is compared with the grade of the software of the other unit whereby the unit (if either) whose software has the higher grade enters a MASTER mode and the unit (if either) whose software has the lower grade enters a SLAVE mode, the unit in the MASTER mode thereafter updating the software stored in the reprogrammable memory means of the unit in the SLAVE mode to the higher grade.

According to the invention, there is further provided apparatus for upgrading software stored in reprogrammable memory means in a computer-controlled unit, comprising interconnecting means for interconnecting the unit with another, similar, unit, means in each unit which is responsive to such interconnection to compare the grade of software stored in its memory means with the grade of software stored in the memory means of the other unit, and reprogramming means in each unit and operative when the comparing means of that unit determines that the grade of software stored in that unit is higher than the grade of software stored in the other unit to upgrade the software stored in the other unit.

According to the invention, there is yet further provided in combination, for a cellular telephone system: (a) at least two mobile communications terminals, each incorporating a microprocessor for controlling its operation which operates under control of software stored in reprogrammable memory means of the terminal which is switchable between a normal operating mode for normal operation of the terminal and a reprogramming mode in which the software can be reprogrammed; and (b) interconnection means for interconnecting the two units in such a manner as to cause their respective memory means to be switched into the reprogramming mode; whereby when so interconnected each unit under control of its respective microprocessor compares the grade of software stored in its memory means with the grade of software stored in the memory means of the other unit to determine which (if either) memory means is storing the software of the higher grade, and whereby the microprocessor means cooperate such that the software of the lower grade is thereafter upgraded to the higher grade.

According to the invention, there is still further provided a mobile communications terminal for use in a cellular telephone system, comprising microprocessor means for controlling the operation of the terminal in dependence on software stored in reprogrammable memory means in the terminal, the memory means being switchable from a normal operating mode to a reprogramming mode by the application of a predetermined voltage thereto, and a source of the predetermined voltage within the terminal; whereby application of the predetermined voltage to the memory means enables the software in the memory means to be loaded into the memory means in another, similar, unit so as to upgrade the software therein and/or to enable the software which it stores to be upgraded by loading into the memory means software from the memory means of another, similar, unit.

According to the invention, there is also provided a cable loom for interconnecting two mobile communications terminals each of which incorporates a microprocessor for controlling its operation and reprogrammable memory means storing software for controlling the microprocessor, the memory means being switchable from a normal operating mode to a reprogramming mode by the application of a predetermined voltage thereto, the cable loom comprising means for applying the predetermined voltage to both memory means so as to switch them into the reprogramming mode whereby the microprocessor means of the units compare the grades of the software respectively stored in the two memory means to determine which (if either) has the higher grade and thereafter cooperate such that software of the higher grade is passed via the cable loom into and is stored in the memory means of the other unit.

In a particular example to be described in more detail below, the invention is applied to the reprogramming of a mobile communications terminal (e.g. a mobile or portable handset) used in a cellular telephone system (in particular, a digital form of such a system). Such a cellular telephone system enables users of mobile or portable handsets to communicate with each other and with telephone users of a PSTN. In such cellular systems, each handset incorporates microprocessor-based equipment for controlling various operations of the handset within the system. The software for controlling the microprocessor is stored within the handset. From time to time, the system provider may update the software (for example, so that it provides additional facilities for subscribers to the system). Such subscribers may therefore wish to update the software within their handsets so as to take advantage of these extra facilities. In a manner to be explained, the invention enables such handsets to be reprogrammed simply, quickly and inexpensively.

Methods and apparatus for reprogramming mobile communications terminals in a cellular telephone system will now be described, by way of example only, with reference to the accompanying diagrammatic drawings in which.

Figure 1:
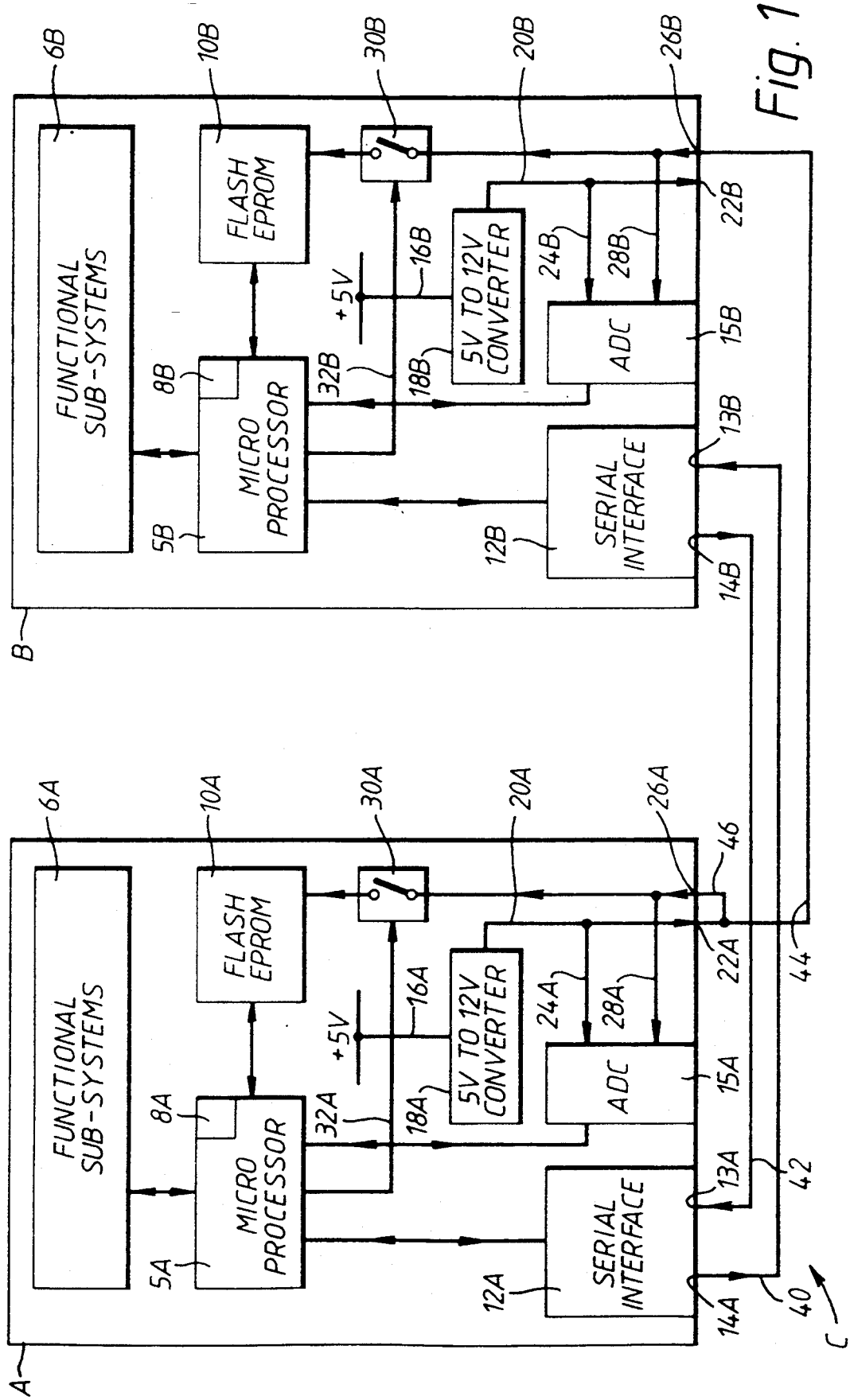
FIG. 1 is a schematic circuit diagram of two such terminals or handsets.

Shown in FIG. 1 are two mobile or portable communications terminals or handsets for use in a cellular telephone system. For example, they may be for use in a digital system such as the GSM pan-European cellular system.

One such handset, A, comprises a microprocessor 5A which controls the basic elements of the handset which are indicated diagrammatically at 6A. Such basic elements comprise the microphone for receiving the voice input, the audio circuitry for processing the resultant signals produced by the microphone, the transmitting and receiving circuitry, and control circuitry for controlling the operation of the handset both in its receiving and transmitting modes.

The microprocessor 5A contains a small amount of memory indicated at 8A. The main storage for the microprocessor, however, is stored in a reprogrammable memory 10A which stores the software controlling the operation of the microprocessor. The reprogrammable memory 10A is in the form of a Flash Eprom.

The handset has a serial interface shown at 12A with input and output terminals 13A and 14A. The normal use of this interface is for testing purposes and for connection to an external power source (e.g. in a vehicle), or to a PC.

The handset also has an analogue to digital converter 15A by means of which analogue input signals can be fed to the microprocessor 5A such as for the purpose of power management.

The handset includes a power supply (not shown) which provides the necessary power supplies for operating the various components of the handset. This power supply produces a 5 volt supply on a line 16A.

However, the handset also incorporates a voltage converter 18A which receives the 5 volt supply from the line 16A and converts it into a 12 volt output on line 20A. This 12 volt supply is fed to an output terminal 22A and also to an input of the analogue to digital converter 15A on a line 24A.

The FLASH Eprom 10A is operable in a normal mode and a reprogramming mode. In its normal mode, it is powered by the 5 volt supply. In its reprogramming mode, however, the FLASH Eprom is supplied with the 12 volt power supply. The reprogramming process will be described in more detail below.

The handset is provided with an input terminal 26A which is connected to another input of the analogue to digital converter via a line 28A and also, via a switch 30A, to the FLASH Eprom. The operation of switch 30A is controlled by the microprocessor by means of signals on a line 32A.

The second handset, B, is identical with handset A. Corresponding items are therefore similarly referenced, but with the suffix "B" instead of "A".

In a manner now to be described in more detail, the two handsets A and B can be interconnected so that the one of them whose FLASH Eprom contains the newest issue of software reprograms the other handset so as to update the software stored in its FLASH Eprom to the same issue number.

This process is carried out by means of a cable loom indicated generally at C. The cable loom comprises duplex links 40 and 42 which interconnect the input and output terminals 13A,13B,14A and 14B of the serial interfaces 12A and 12B of the respective handsets. In addition, the cable loom includes a link 44 which connects the 12 volt output terminal 22A of handset A with terminal 26B of handset B.

Finally, the cable loom incorporates a link 46 which connects terminals 22A and 26A of handset A.

It is assumed that handsets A and B are handsets operating in a cellular telephone system and that there has been an update of the handset-controlling software. It is also assumed that the software in one of the handsets has been updated while the software in the other handset is of the previous or an earlier version (or lower issue number). The updated software may have been placed into the first-mentioned handset by means of special programming equipment—or (using a third, re-programmed, handset) by means of the method now to be described. Irrespective of the manner in which it has been re-programmed, however, it is caused to re-program the second handset by connecting the two handsets by means of the cable loom C. In a manner now to be described, this automatically causes the re-programming process to start.

Once the two handsets have been interconnected by the cable loom C, handset A is powered ON. This powering-ON process causes the microprocessor 5A (in response to its operating program stored in memory 8A) to check for the presence of a 12 volt supply at terminal 26A. This checking process is carried out via the analogue to digital converter 15A. In the present instance, of course, the cable loom C will provide a link (link 46) between terminals 22A and 26A and will thus provide a 12 volt supply on line 28A. The microprocessor 5A reacts to this by closing switch 30A to enter the reprogramming mode.

Under normal operating circumstances, when the cable loom C is not used, powering ON of the hand set will not produce a 12 volt supply on line 28A, and the handset will thus enter the normal operating mode.

The second handset B is now powered ON. In response to this powering-ON, this handset likewise checks for the presence of a 12 volt supply on terminal 26B. Such a 12 volt supply will be present, because of link 44 in cable loom C. Handset B therefore likewise enters the reprogramming mode, upon closure of switch 30B.

Figure 2A:
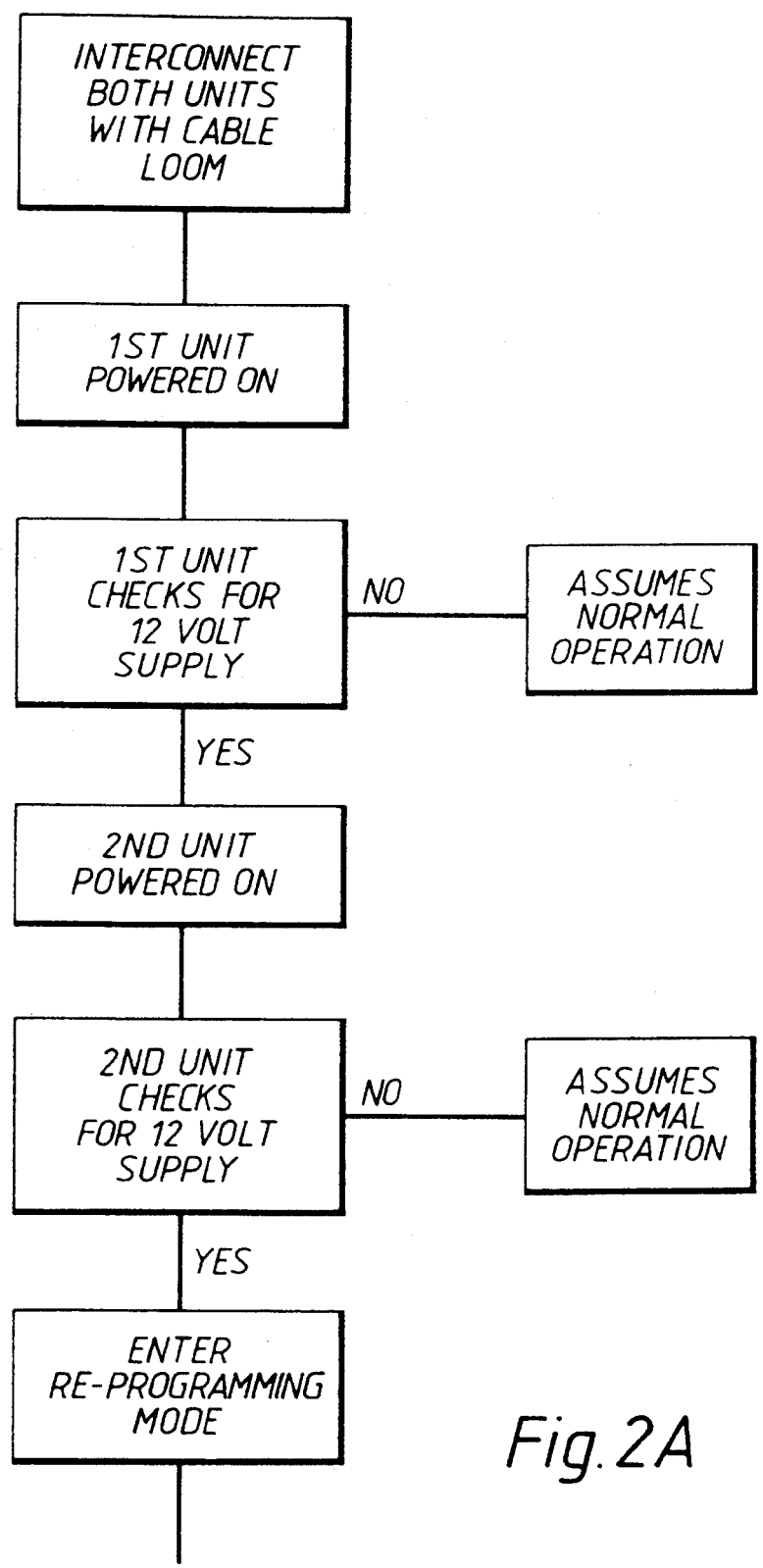
FIG. 2 is a flow chart for explaining the operation of the methods and apparatus, FIG. 2 being depicted on separate sheets identified as FIG. 2A and FIG. 2B.
Figure 2B:
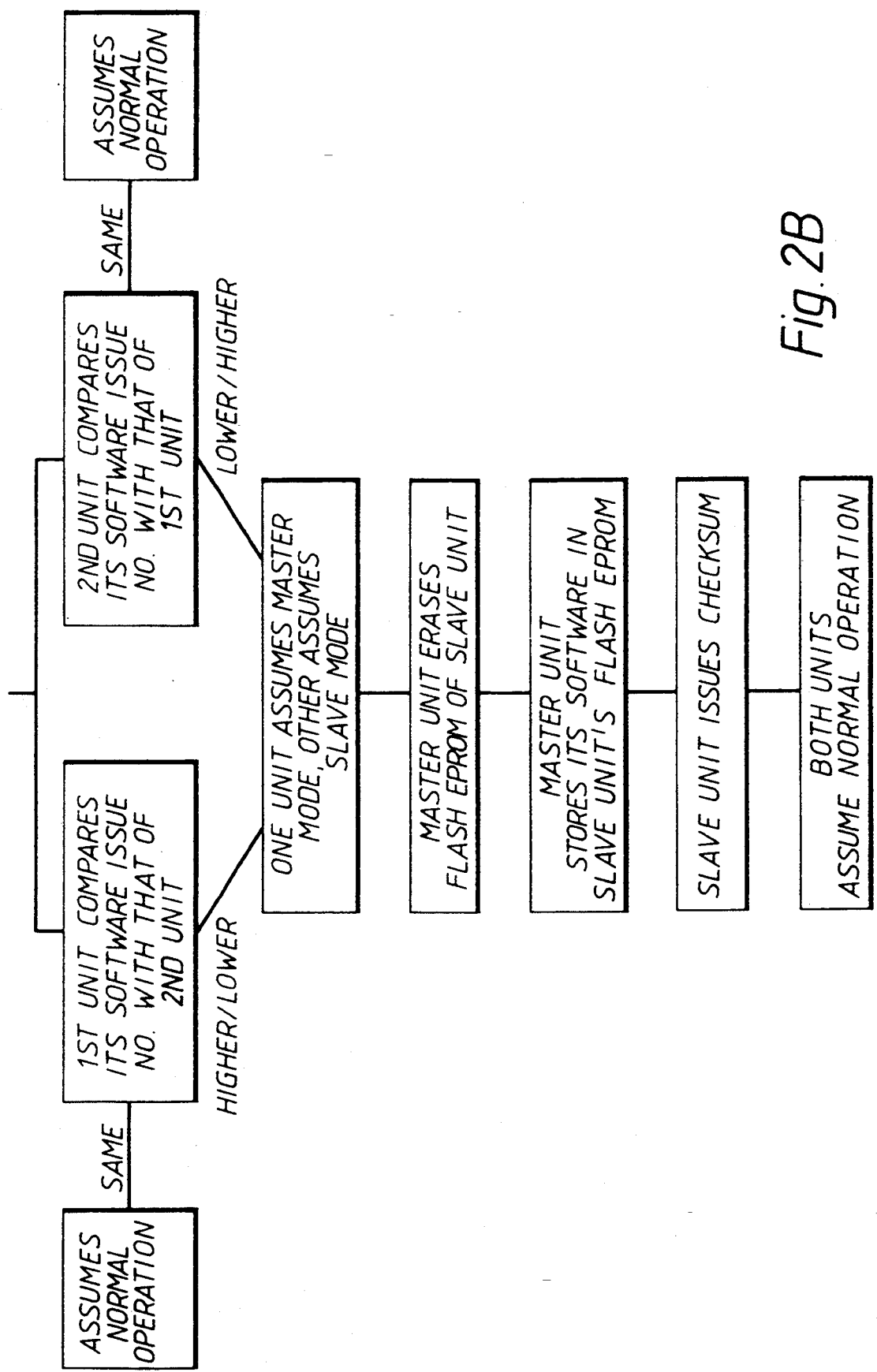

As shown in the flow diagram of FIG. 2, each handset, now in the reprogramming mode, transmits the issue number of its software from the output terminal of its interface 12A,12B to the input terminal of the interface of the other handset, and each handset checks the software issue number received.

As handset A was the first one to be powered ON, it will be the first to transmit its software issue number and it will thus be waiting for the software issue number from handset B when the latter is powered ON. Handset A compares its own software issue number with the software issue number received from handset B. If the latter issue number is lower than its own issue number, handset A enters the MASTER mode. If, on the other hand, the issue number received is greater than its own issue number, it enters the SLAVE mode. In either case, it re-issues its own issue number to handset B. Handset B carries out a similar process and therefore either enters the MASTER or SLAVE mode.

If both handsets receive equal issue numbers, they return to normal operation. Likewise, each returns to normal operation if it does not receive an issue number from the other handset within a predetermined time.

At the end of this process, both handsets are either in normal operation or one is in MASTER mode and the other is in SLAVE mode. Assuming that the latter is the case, the handset in MASTER mode takes control of all future interaction between the two units.

More specifically, the handset in MASTER mode commands the other handset (in SLAVE mode) to erase all the software from its FLASH Eprom. Such erasing can take place because the FLASH Eprom is powered by the 12 volt supply. The handset in MASTER mode then downloads into the FLASH Eprom of the other handset the new issue of software, this downloading process taking place in blocks until the FLASH Eprom of the handset in SLAVE mode has been completely re-programmed with the higher issue software. On completion of the process, the handset in SLAVE mode returns a checksum to the other handset to confirm completion of the operation.

The software for controlling this reprogramming process is held in memory 8A,8B of each microprocessor 5A,5B.

If this reprogramming procedure is interrupted, the controlling software in the memory 8A,8B of the handset operating in the SLAVE mode causes that handset to assume a special software issue number; this issue number is the lowest possible and represents the presence of invalid or corrupted software—that is, to reflect the fact that the re-programming process has been interrupted so that the FLASH Eprom contains invalid software. On any subsequent powering ON of this handset, the presence of this special issue number will cause the unit automatically to enter the SLAVE mode.

In the manner described, therefore, a simple cable loom enables one handset to re-program another one with the latest issue software. A user owning a number of different handsets merely has to have one of them re-programmed by the service provider and he can then use that re-programmed hand set to re-program all his other handsets. It will be apparent that each handset re-programmed in the manner described could then itself be used to re-program another handset. In this way, after the first re-programming operation, there are two handsets capable of carrying out subsequent re-programming. After each of those has carried out further re-programming, there will then be four handsets capable of carrying out subsequent re-programming; and so on.

It is also possible for a handset operating in the MASTER mode to be connected not merely to one but several other handsets—by a modified form of the cable loom C—so as to re-program them all. When a group of handsets is interconnected in this way, one of the handsets would issue a broadcast command to all the others. Each of the other handsets would then respond by signalling the controlling handset with an identifying signal, such as corresponding to its serial number. In order to prevent all the responding handsets from responding simultaneously, they could be arranged to respond sequentially after respective delays determined by their serial numbers. The controlling handset would thus receive the serial numbers of all the other handsets and could then address each of them in turn, asking them to send their respective software issue numbers. Those with lower issue numbers would thus enter the SLAVE mode and the re-programming process described above would then take place.

Various modifications can be made. For example, it may be advantageous to omit the 5 volt to 12 volt converter 18 from each handset but to provide this externally, as part of the cable loom C. This would help to prevent inadvertent corruption of the software which might result from incorrect or unintended interconnection of terminals 22 and 26.

The interface 12 could be a parallel interface instead of a serial interface.

Although the method and apparatus have been described with reference to the use of a FLASH Eprom in each hand set, other suitable forms of reprogrammable memory could be used instead.

What is claimed is:

1. A method of controlling the reprogramming of software stored in reprogrammable memory means of either one of at least two microprocessor-based telecommunications units, the two telecommunications units being interconnectable by a telecommunications network for telecommunication with each other over the network, each reprogrammable memory means being switchable between a normal operating mode in which its software is used for controlling telecommunications over the network and is not reprogrammable and a reprogrammable mode, the method comprising the steps of:

interconnecting the two units with interconnection means which is independent of the telecommunications network, the reprogrammable memory means of a first one of the units responding to the interconnection by the interconnection means by switching into the reprogrammable mode, the first unit when switched into the reprogrammable mode causing the reprogrammable memory means of the second unit to switch into the reprogrammable mode, each unit when switched into the reprogrammable mode signalling to the other unit the current grade of the software stored in its reprogrammable memory means;

each unit carrying out a comparison step by which the grade of its software is compared with the grade of the software of the other unit whereby the unit whose software has the higher grade enters a MASTER mode and the unit whose software has the lower grade enters a SLAVE mode, the unit in the MASTER mode thereafter upgrading the software stored in the reprogrammable memory means of the unit in the SLAVE mode to the higher grade.

2. A method according to claim 1, in which the unit in the SLAVE mode responds to interruption of the upgrading step before its completion by storing, in its memory means, data signifying storage of corrupt software.

3. A method according to claim 2, in which the said data indicates the lowest grade of software.

4. A method according to claim 1, in which the upgrading step comprises the steps of erasing the software of the lower grade from the memory means of the unit in the SLAVE mode, and loading into that memory means software of the higher grade from the memory means of the unit in the MASTER mode.

5. A method according to claim 1, in which the steps of switching each reprogrammable memory means into the reprogrammable mode comprise the steps of applying a predetermined electrical voltage to each unit by means of the interconnection means.

6. The combination, for a telecommunications system, of:

at least two telecommunications terminals interconnectable by a telecommunications network, each terminal incorporating a microprocessor for controlling its operation, the microprocessor of each terminal being operable under control of software stored in reprogrammable memory means of that terminal, said memory means being switchable between a normal operating mode for normal telecommunications operation of the terminal and in which mode it is not reprogrammable, and a reprogramming mode in which the software can be reprogrammed; and interconnection means for interconnecting the two terminals independent of their interconnection by the telecommunications network.

each terminal including means responding to the interconnection of the two terminals by the interconnection means by causing their respective memory means to be switched into the reprogramming mode;

comparing means in each unit which is operative under control of its respective microprocessor when the two terminals are interconnected by the interconnection means to compare the grade of software stored in its memory means with the grade of software stored in the memory means of the other terminal to determine which memory means is storing the software of the higher grade; and upgrading means in each the microprocessor means operative to upgrade the software of the lower grade to the higher grade.

7. The combination of claim 6, including means in each terminal operative in response to interruption of the upgrading means to enter data in the terminal whose software is being upgraded to indicate corruption of the software therein and to block operation of the upgrading means of that terminal.

8. The combination of claim 7, in which the said data represents the lowest grade of software.

9. The combination of claim 6, in which each terminal is a mobile communications terminal.

10. The combination of claim 9, in which each mobile communications terminal is a cellular telephone unit and the telecommunications network is a cellular telephone network.

11. The combination of claim 6, in which each reprogrammable memory means comprises a FLASH Eprom which is switchable from the normal operating mode to the reprogramming mode by the application of a predetermined voltage to the FLASH Eprom.

12. The combination according to claim 11, in which each terminal includes a source for the predetermined voltage, and the interconnection means applies the predetermined voltage from the source in one said terminal to the FLASH Eprom in that terminal and to the FLASH Eprom in the other terminal.

13. The combination according to claim 11, in which the interconnection means includes a source for predetermined voltage, and means for applying the predetermined voltage to the FLASH Eproms of both terminals.

* * * * *